US006972210B2

(12) United States Patent
Pourquier et al.

(10) Patent No.: US 6,972,210 B2
(45) Date of Patent: Dec. 6, 2005

(54) METHOD FOR MAKING A COLOR IMAGE SENSOR WITH PAD-TO-PAD SOLDERED SUPPORTING SUBSTRATE

(75) Inventors: Eric Pourquier, Voreppe (FR); Philippe Rommeveaux, Coublevie (FR)

(73) Assignee: Atmel Grenoble S.A., Saint Egreve (FR)

( * ) Notice: Subject to any disclaimer, the term of this patent is extended or adjusted under 35 U.S.C. 154(b) by 0 days.

(21) Appl. No.: 10/485,741

(22) PCT Filed: Aug. 30, 2002

(86) PCT No.: PCT/FR02/02980

§ 371 (c)(1), (2), (4) Date: Feb. 4, 2004

(87) PCT Pub. No.: WO03/019670

PCT Pub. Date: Mar. 6, 2003

(65) Prior Publication Data
US 2004/0266052 A1 Dec. 30, 2004

(30) Foreign Application Priority Data
Aug. 31, 2001 (FR) .................................. 01 11337

(51) Int. Cl.[7] .............................................. H01L 21/00
(52) U.S. Cl. ............................. 438/57; 438/70; 438/73
(58) Field of Search .................... 438/22–99, 106–127, 438/455–465, 977

(56) References Cited

U.S. PATENT DOCUMENTS

| | | | |
|---|---|---|---|
| 5,144,747 A | 9/1992 | Eichelberger | |
| 5,561,295 A | 10/1996 | Jacksen et al. | |
| 5,665,607 A | 9/1997 | Kawama et al. | |
| 6,257,491 B1 | 7/2001 | Fazekas et al. | |
| 6,465,271 B1 * | 10/2002 | Ko et al. | 438/48 |
| 6,770,503 B1 * | 8/2004 | Marinis et al. | 438/48 |
| 6,790,690 B2 * | 9/2004 | Lifka et al. | 438/26 |
| 6,846,703 B2 * | 1/2005 | Shimoda et al. | 438/109 |
| 2002/0019069 A1 * | 2/2002 | Wada | 438/69 |

FOREIGN PATENT DOCUMENTS

EP  1 094 511 A  4/2001

* cited by examiner

Primary Examiner—Savitri Mulpuri
(74) Attorney, Agent, or Firm—Lowe Hauptman & Berner

(57) ABSTRACT

The invention relates to the making of color image sensors for miniature cameras. The method of fabrication includes the formation on the front face of a semi-conductive wafer of a series of active zones comprising image detection circuits, each corresponding to a respective image sensor. Each active zone is surrounded by input/output pads. The wafer is transferred by its front fact against the front face of a supporting substrate. The major part of the thickness of the semiconductor wafer is eliminated, leaving a very fine semi-conductive layer including the image detection circuits on the substrate. This method is characterized in that firstly, layers of color filters are deposited and then etched on the semi-conductive layer thus thinned. Secondly, the substrate includes connection pads laid out with the same geometry as the pads of each active zone so as to come into a position facing these pads during the transfer, to solder a respective pad of the substrate to a corresponding pad of the semi-conductive wafer. Finally, the substrate is diced into individual sensors after the deposition of the color filters.

15 Claims, 2 Drawing Sheets

METHOD FOR MAKING A COLOR IMAGE SENSOR WITH PAD-TO-PAD SOLDERED SUPPORTING SUBSTRATE

RELATED APPLICATIONS

The present application is based on International Application No. PCT/FR02/02980 filed Aug. 30, 2002, entitled "METHOD FOR MAKING A COLOR IMAGE SENSOR WITH PAD-TO-PAD SOLDERED SUPPORTING SUBSTRATE", which in turn corresponds to French Application FR 01/11337 filed Aug. 31, 2001, and priority is hereby claimed under 35 USC Section 119 based on these applications. Each of these applications are hereby incorporated by reference herein in their entirety into this application.

FIELD OF THE INVENTION

The invention relates to electronic image sensors, and especially to very small-sized sensors with dimensions that enable the making of miniature cameras such as those that are to be incorporated into a portable telephone.

BACKGROUND OF THE INVENTION

Apart from great compactness, the image sensor should have high sensitivity under weak light and good colorimetrical performance.

SUMMARY OF THE INVENTION

Furthermore, the entire camera needs to be made by the most economical methods possible so that the apparatus is not prohibitively costly.

To achieve this result, it is sought, firstly, to make the image sensor and the electronic processing circuits if possible on a same silicon substrate and, secondly, as far as possible, to carry out the deposition of the different layers, the etching operations, the heat-processing operations etc. collectively on a silicon wafer comprising many identical sensors and then dice the wafer into individual sensors.

However, the methods hitherto proposed for making color image sensors and the structures of these sensors are not entirely satisfactory from this viewpoint. The methods of manufacture are not industrially efficient; they remain far too costly and their efficiency is far too low for large-scale manufacturing applications, or else the performance of the image sensor is not high enough.

The present invention proposes a method of manufacture and a corresponding image sensor that minimizes the costs of manufacture while having good qualities, and especially compactness, high sensitivity and high colorimetrical performance.

To this end, the invention proposes a method for making an image sensor, comprising:

the formation, on the front face of a semiconductive wafer, preferably made of monocrystalline silicon, of a series of active zones comprising image detection circuits and each corresponding to a respective image sensor, each active zone being surrounded by input/output pads, the transfer of the wafer by its front face against the front face of a supporting substrate, the elimination of the major part of the thickness of the semiconductive wafer, leaving a very fine semiconductive layer, comprising the image detection circuits, on the substrate, this method being characterized in that:

firstly, layers of color filters are deposited and then etched on the semiconductive layer thus thinned, secondly the substrate includes connection pads laid out with the same geometry as the pads of each active zone so as to come into a position facing these pads during the transfer, to solder a respective pad of the substrate to a corresponding pad of the semiconductive wafer;

and finally, the substrate is diced into individual sensors after the deposition and the etching of the color filters.

The substrate may be a simple supporting substrate to rigidly hold the semiconductive wafer before, during or after its thinning.

However, it can also be planned that the substrate which bears interconnection pads will also bear interconnection conductors and, possibly, also active and passive circuit elements, for example control circuits for the image detection circuits present in the semiconductive wafer, or again signal-processing circuits associated with the image sensor.

After the thinning of the semiconductive wafer, in principle deep apertures will be formed in the thickness of the remaining semiconductive layer. These apertures will extend to the lower surface of the connection pads which will have been formed beforehand on the wafer, prior to transfer to the substrate. These apertures enable access to the pads which will then constitute input/output pads of the sensor.

The semiconductive wafer will be transferred to the substrate for example by ball reflow using indium balls placed on the pads while the wafer and the substrate are in contact with their facing pads.

The active zones of the wafer may comprise a matrix of photosensitive elements as well as control circuits of the matrix and associated image-processing circuits receiving signals coming from the photosensitive elements of the active zone.

The thinning of the semiconductive wafer after transfer to the substrate and before the deposition of the color filters can be done in many different ways: thinning by lapping, chemical thinning, a combination of both types of thinning (firstly mechanical thinning and then chemical finishing or else mechanical machining in the presence of chemicals). The thinning can also be done by a preliminary embrittlement of the wafer at the desired cutting plane, in particular by in-depth hydrogen implantation in the desired dicing plane. In this case, the hydrogen implantation is done at a shallow depth in the semiconductive wafer before the transfer of the wafer to the substrate. The thinning is then done by heat processing which dissociates the wafer at the level of the implanted dicing plane, leaving a thin semiconductive layer in contact with the substrate.

The very great thinning of the wafer reduces its thickness from several hundreds of micrometers before transfer to the substrate to 3 to 20 micrometers after transfer to the substrate. Thinning is a major factor in the quality of the sensors since it enhances colorimetrical performance and sensitivity. With non-thinned sensors, illuminated by the side in which the many insulating and conductive layers that serve to define the image detection circuits are formed, the light that has crossed a color filter is scattered over photosensitive dots corresponding to different colors, thus impairing colorimetrical performance. Furthermore, the sensitivity of a thinned sensor is improved because the photons reach a wider silicon region than in the case of the non-thinned sensors, since they are not stopped by the metal layers which are opaque and take up a large part of the surface area corresponding to each photosensitive dot.

It will be understood that the thinning, however, complicates the problems of manufacture because, after thinning, the silicon loses its rigidity and becomes very brittle, and that, furthermore, there arises the problem of connecting the image detection circuits with the exterior. The solution of the invention mitigates this difficulty and enables the efficient fabrication of the image sensors.

For example, the thickness of the substrate is about 500 micrometers for a substrate with a diameter of 15 to 20 cm. The thickness of the silicon wafer is 500 to 1000 micrometers before thinning (with a diameter of 15 to 30 centimeters), and then 3 to 20 micrometers after thinning.

A filler substance (resin) will generally be provided for in the intervals between the connection pads to improve the rigidity of the bond between the substrate and the silicon wafer. This filler material protects the active circuit elements of the wafer.

The sensor is illuminated from the thinned silicon layer side and not from the supporting substrate side.

Finally, on the thinned silicon layer, covered with color filters, it is possible to place a sheet of transparent material or a passivation layer. These operations can be carried out either on the individual separated sensors or preferably on the substrate in wafer form, before it is diced into individual sensors.

BRIEF DESCRIPTION OF THE DRAWING

Other features and advantages of the invention shall appear from the following detailed description, made with reference to the appended drawings, of which.

DETAILED DESCRIPTION OF THE INVENTION

Figure 1:
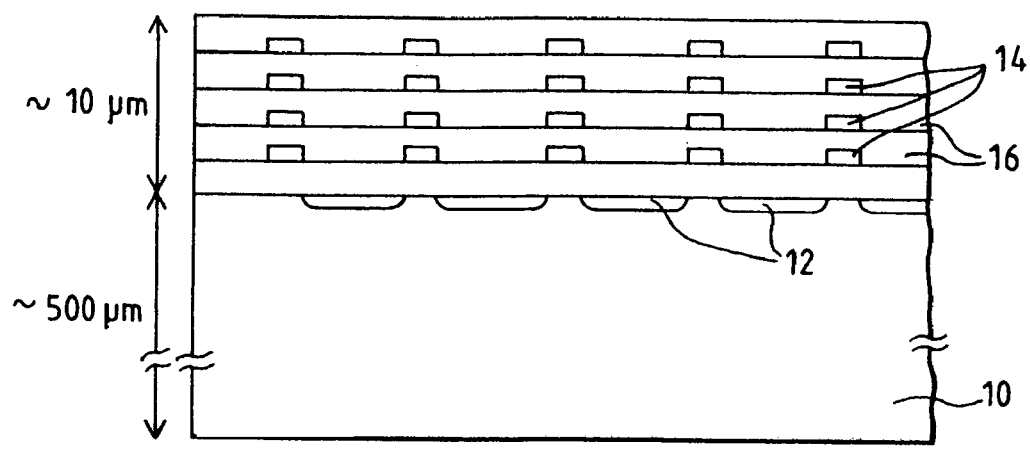
FIG. 1 shows the structure of an image sensor made on a silicon wafer before the positioning of color filters.

FIG. 1 shows the general structure of a silicon wafer on which classic techniques have been used to make the image detection circuits of a multiplicity of image sensors.

The silicon wafer 10 has a thickness of several hundreds of micrometers, for a diameter of 150 to 300 millimeters.

The image detection circuits (the matrix of photosensitive dots, transistors and interconnections) are fabricated on one face of the silicon wafer, which may be called the front face and is the upper face in FIG. 1. Fabrication implies, firstly, various operations of diffusion and implantation in the silicon, from the upper face of the wafer, to form especially photosensitive zones 12, and, secondly, successive operations for the deposition and etching of conductive layers 14 and insulating layers 16 forming a stack on top of the photosensitive zones 12. The insulating and conductive layers form part of the image detection circuits and enable the collection of electrical charges generated in the photosensitive zones by an image projected on the sensor.

One of the conductive layers 14, in principle the last deposited layer, is used to form input/output pads of each individual sensor (pads not seen in FIG. 1) around an active zone comprising the matrix of photosensitive dots. These pads are flush with the upper surface of the silicon wafer which is covered, as the case may be, with a planarization layer designed to remove the relief features and hollows present on the surface of the wafer after the formation of the stack of etched layers 14 and 16.

If the sensor were to be made with a classic technology, then a mosaic of color filters would be deposited on the surface of the wafer.

Figure 2:
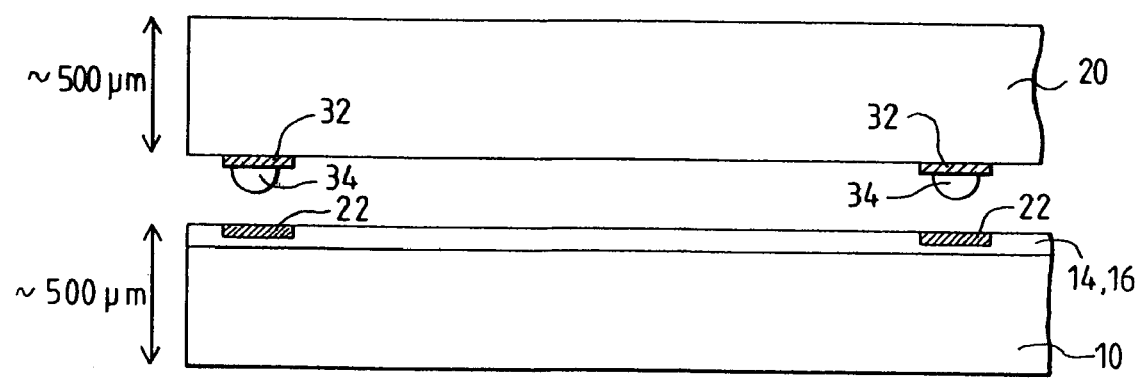
FIG. 2 shows the operation of transfer of the silicon wafer by its front face to a supporting substrate.

According to the invention, no color filters are deposited at this stage but the wafer is transferred by its front face on to a supporting substrate 20 (FIG. 2). The supporting substrate is a wafer having the same diameter as the wafer 10 and a similar thickness to ensure the rigidity of the structure during fabrication. Besides, it may be constituted by another silicon wafer.

FIG. 2 represents the structure on a smaller scale than that of FIG. 1 in order to show the entire individual sensor including an active zone ZA and connection pads 22 around the active zone ZA.

On its front face (facing downwards in FIG. 2), the supporting substrate 20 has conductive pads 32 which are positioned exactly so as to face the pads 22. The silicon wafer 10 is transferred to the substrate 20 by the soldering of the pads 22 to the pads 32 throughout the surface of the silicon wafer.

The soldering can be done by ball reflow (using for example indium balls) 34 deposited and soldered beforehand to the pads 22 of the wafer or to the pads 32 of the supporting substrate.

Figure 3:
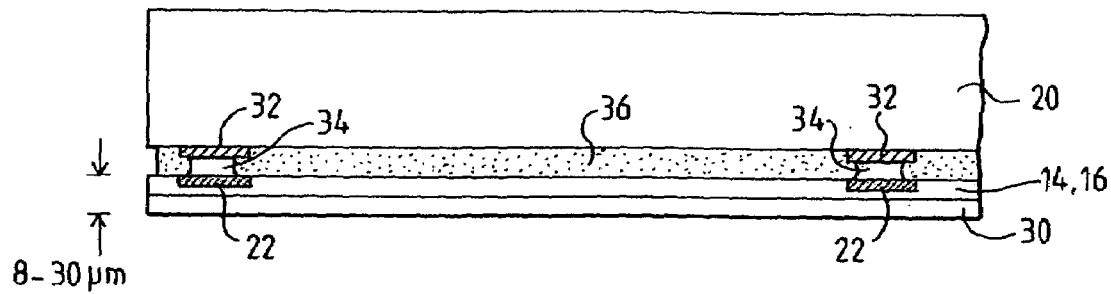
FIG. 3 shows the supporting substrate with the silicon wafer after thinning of the wafer.

As can be seen in FIG. 3, a filler resin 36 is preferably provided between the wafer and the substrate, in the space not occupied by the pads 22 and 32. This resin provides for the mechanical firmness of the structure after the operation for the thinning of the silicon wafer.

After the silicon wafer has been transferred by its front face to the supporting wafer, the major part of the thickness of the silicon wafer 10 is eliminated so as to leave only a thickness of about 8 to 30 micrometers, including the thickness of the stack of layers 14, 16. What remains of the silicon wafer is no more than a superimposition of a few micrometers (for example five to ten micrometers) for the stack of layers 14, 16 and about three to 20 micrometers for the remaining silicon thickness, including the photosensitive zones 12. The remaining thickness is that of the layer 30 of FIG. 3 containing the photosensitive zones 12 of FIG. 1.

The thinning operation can be done by mechanical machining (lapping) terminated by chemical machining, or by chemical machining only, or by mechanical machining in the presence of chemicals or again by a particular method of separation necessitating a preliminary implantation of an embrittling impurity in the plane that will demarcate the thinned silicon layer.

In the case of this separation by implantation of impurities, the implantation must be done before the transfer of the silicon wafer to the supporting wafer. Indeed, the implantation is done by the front face of the silicon wafer, throughout the surface of the wafer and at a depth that will define the dicing plane. The preliminary implantation is preferably hydrogen implantation. It can be done at various stages of the making of the wafer, but the separation of the thickness of the wafer along the implanted dicing plane can be done only when the silicon wafer has been attached to the supporting wafer.

The upper surface of the thinned silicon layer 30 can be processed (fine lapping, chemical cleaning, mechanical/chemical polishing, etc.) in order to eliminate the surface defects, giving a multiple-sensor wafer whose general structure is that of FIG. 2.

Figure 4:
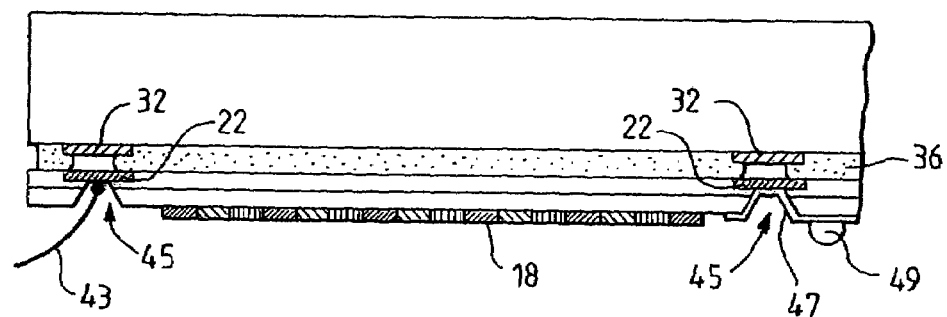
FIG. 4 shows the supporting substrate bearing a layer of thinned silicon on which a mosaic of color filters has been deposited and in which access apertures to connection pads have been formed.

A mosaic of color filters 18 is then deposited on the surface of the layer 30 (FIG. 4). However, one or more additional layers can be deposited before the deposition of the color filters, especially passivation layers, anti-reflection layers, electrical activation layers etc.

If necessary, a planarization layer 24 is deposited on the mosaic of filters. It must be transparent.

Apertures 45 are hollowed out in the thinned silicon wafer, before or after the positioning of the color filters, to enable electrical access to the rear of the connection pads 22 which had been formed on the front face of the silicon wafer.

Electrical access can be obtained directly inside these apertures as can be seen in the left-hand part of FIG. 4. In this case, wires 43 are soldered to the pads inside the apertures 45. The electrical access can be also be obtained indirectly by the redeposition of a conductive layer 47 that comes into contact, inside the apertures 45, with the pads 22 and that comprises a part outside the apertures 45. This variant is shown in the right-hand part of FIG. 4; it enables especially a "flip-chip" type of transfer to a printed circuit board. Conductive bosses 49 may be formed for this purpose on the metallizations 47.

After the positioning of the color filters and the formation of the apertures providing access to the connection pads 22, a glass film, or an individual lens for the image sensor, or a matrix of microlenses having the same pitch as the color filters 18 may be deposited on the rear face (the face that will be illuminated) of the structure. These elements are not shown in the figures.

It will be noted that the structure formed on the substrate 20 may be tested on the wafer by means of the connection pads thus made. The test may be performed in the presence of light, image patterns, etc.

The structure is diced into individual sensors for packaging only at the end of this fabrication process.

Finally, the substrate 20 may itself be constituted by a silicon substrate in which there are formed interconnections or even integrated circuits designed to be associated with image detection circuits of the sensor (for example control circuits for the sequencing of the row and column control signals of the photosensitive matrix contained in the silicon wafer 10). It is then the input/output pads of these integrated circuits contained in the substrate 20 that can serve as electrical connection points with in/output pads of the image detection circuits of the sensor and serve as soldering spots for the transfer of the wafer 10 to the substrate 20.

Still other objects and advantages of the present invention will become readily apparent to those skilled in the art from the following detailed description, wherein the preferred embodiments of the invention are shown and described, simply by way of illustration of the best mode contemplated of carrying out the invention. As will be realized, the invention is capable of other and different embodiments, and its several details are capable of modifications in various obvious aspects, all without departing from the invention. Accordingly, the drawings and description thereof are to be regarded as illustrative in nature, and not as restrictive.

What is claimed is:

1. A method for making an image sensor, comprising the steps of:

forming, on the front face of a semiconductive wafer, of a series of active zones including image detection circuits, each corresponding to a respective image sensor, each active zone being surrounded by input/output pads, transferring of the wafer by its front face against the front face of a supporting substrate;

eliminating a major part of the thickness of the semiconductive wafer, leaving a thin semiconductive layer, including the image detection circuits, on the substrate, depositing layers of color filters and then etching on the thin semiconductive layer, laying out the substrate including connection pads with the same geometry as the pads of each active zone so as to come into a position facing these pads during the transfer, to solder a respective pad of the substrate to a corresponding pad of the semiconductive wafer;

wherein after eliminating the major part of the thickness of the semiconductor wafer, apertures are formed in the thin semiconductor layer, these apertures extending to the lower surface of the connection pads which have been formed beforehand on the wafer, prior to transfer to the substrate dicing the substrate into individual sensors after the deposition and the etching of the color filters.

2. The method according to claim 1, wherein the supporting substrate bears circuits associated with the image detection circuits contained in the semiconductive layer.

3. The method according to claim 1, wherein the thickness of the semiconductive layer remaining after thinning is about 5 to 20 micrometers.

4. The method according to claim 1, wherein a filler substance is provided for in the intervals between the connection pads to improve the firmness of the bond between the substrate and the silicon wafer.

5. The method according to claim 1, wherein on the thin semiconductive layer, covered with color filters, a sheet of transparent material or a passivation layer is placed.

6. The method according to claim 2, wherein the supporting substrate bears circuits associated with the image detection circuits contained in the semiconductive layer.

7. The method according to claim 2, wherein the thickness of the semiconductive layer remaining after thinning is about 5 to 20 micrometers.

8. The method according to claim 1, wherein the thickness of the semiconductive layer remaining after thinning is about 5 to 20 micrometers.

9. The method according to claim 2, wherein a filler substance is provided for in the intervals between the connection pads to improve the firmness of the bond between the substrate and the silicon wafer.

10. The method according to claim 1, wherein a filler substance is provided for in the intervals between the connection pads to improve the firmness of the bond between the substrate and the silicon wafer.

11. The method according to claim 3, wherein a filler substance is provided for in the intervals between the connection pads to improve the firmness of the bond between the substrate and the silicon wafer.

12. The method according to claim 2, wherein on the thin semiconductive layer, covered with color filters, a sheet of transparent material or a passivation layer is placed.

13. The method according to claim 1, wherein on the thin semiconductive layer, covered with color filters, a sheet of transparent material or a passivation layer is placed.

14. The method according to claim 3, wherein on the thin semiconductive layer, covered with color filters, a sheet of transparent material or a passivation layer is placed.

15. The method according to claim 4, wherein on the thin semiconductive layer, covered with color filters, a sheet of transparent material or a passivation layer is placed.

* * * * *